US 10,945,344 B2

(12) United States Patent
Lee

(10) Patent No.: US 10,945,344 B2
(45) Date of Patent: Mar. 9, 2021

(54) ELECTRONIC DEVICE INCLUDING BATTERY MODULE AND METHOD FOR MANUFACTURING THE SAME

(71) Applicant: Samsung Electronics Co., Ltd., Gyeonggi-do (KR)

(72) Inventor: Jin-Woo Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/676,805

(22) Filed: Nov. 7, 2019

(65) Prior Publication Data

US 2020/0093013 A1    Mar. 19, 2020

Related U.S. Application Data

(63) Continuation of application No. 15/786,739, filed on Oct. 18, 2017, now Pat. No. 10,477,708.

(30) Foreign Application Priority Data

Oct. 18, 2016   (KR) .................. 10-2016-0135099

(51) Int. Cl.
*H05K 5/00*       (2006.01)
*H01M 2/10*      (2006.01)
(Continued)

(52) U.S. Cl.
CPC ........ *H05K 5/0086* (2013.01); *H01M 2/1061* (2013.01); *H01M 2/1066* (2013.01);
(Continued)

(58) Field of Classification Search
CPC .......... H05K 2/02; H05K 2/0247; H05K 7/02; H01M 2/02–06; H01M 2/0212; H01M 2/30–36; H01M 10/42; H01M 10/425
(Continued)

(56) References Cited

U.S. PATENT DOCUMENTS 6,782,616 B2    8/2004   Eldredge
6,844,105 B1    1/2005   Hanafusa et al.
(Continued)

FOREIGN PATENT DOCUMENTS

CN    1348611 A    5/2002
CN    1913197 A    2/2007
(Continued)

OTHER PUBLICATIONS

Chinese Search Report dated Aug. 27, 2020.

*Primary Examiner* — Tuan T Dinh
(74) *Attorney, Agent, or Firm* — Cha & Reiter, LLC.

(57) ABSTRACT

According to an embodiment of the present disclosure, an electronic device comprise a housing including a mounting hole in which a battery module is mounted and a printed circuit board disposed adjacent to the mounting hole and electrically connected with the battery module, wherein the battery module include a battery cell having a connector projecting in a first direction, a terminal circuit including at least one connecting terminal electrically connected with the connector, a supporting case disposed at a side of the battery cell, seating the terminal circuit therein, and having an opening to expose at least part of the connecting terminal of the terminal circuit, and at least one upper film unit disposed facing a surface of the supporting case to protect the battery cell or the terminal circuit. According to the present disclosure, an electronic device including a battery module eliminates the need for an FPCB, leading to cost savings and simplified assembly.

20 Claims, 12 Drawing Sheets

(51) Int. Cl.
   *H01M 10/42*   (2006.01)
   *H01R 12/73*   (2011.01)
   *H01R 24/68*   (2011.01)

(52) U.S. Cl.
   CPC ........ *H01M 10/425* (2013.01); *H01R 12/732* (2013.01); *H01R 24/68* (2013.01); *H05K 5/0069* (2013.01)

(58) Field of Classification Search
   USPC ............... 361/748, 760–762, 767, 775–777, 361/807–810, 814; 429/162–179, 17, 429/61–63, 91–99
   See application file for complete search history.

(56) References Cited

U.S. PATENT DOCUMENTS

| | | | |
|---|---|---|---|
| 7,262,956 B2 | 8/2007 | Suzuki et al. | |
| 8,415,045 B2 | 4/2013 | Miyajima et al. | |
| 8,727,813 B2 | 5/2014 | Yang et al. | |
| 8,858,270 B2* | 10/2014 | Pavlinsky | H01M 2/22 439/775 |
| 8,991,232 B2* | 3/2015 | Okutani | H01M 2/024 72/356 |
| 2005/0208346 A1 | 9/2005 | Moon et al. | |
| 2006/0194101 A1* | 8/2006 | Ha | H01M 2/305 429/158 |
| 2007/0037044 A1 | 2/2007 | Sato et al. | |
| 2007/0037046 A1 | 2/2007 | Takahashi et al. | |
| 2007/0154785 A1 | 7/2007 | Seo et al. | |
| 2009/0155631 A1 | 6/2009 | Baek et al. | |
| 2009/0209299 A1 | 8/2009 | Lin et al. | |
| 2011/0052940 A1* | 3/2011 | Koh | H01M 2/06 429/7 |
| 2011/0117392 A1 | 5/2011 | Kim | |
| 2011/0250489 A1* | 10/2011 | Baek | F16B 25/0021 429/163 |
| 2012/0070697 A1* | 3/2012 | Baek | H01M 2/263 429/7 |
| 2012/0121945 A1 | 5/2012 | Kim | |
| 2013/0171490 A1 | 7/2013 | Rothkopf et al. | |

FOREIGN PATENT DOCUMENTS

| | | |
|---|---|---|
| CN | 1918726 A | 2/2007 |
| EP | 1 160 895 A1 | 12/2001 |
| EP | 1 753 050 A2 | 2/2007 |

* cited by examiner

ELECTRONIC DEVICE INCLUDING BATTERY MODULE AND METHOD FOR MANUFACTURING THE SAME

CROSS REFERENCE TO RELATED APPLICATION(S)

This application is a Continuation of U.S. patent application Ser. No. 15/786,739 filed on Oct. 18, 2017 which claims the benefit under 35 U.S.C. § 119(a) of a Korean patent application filed in the Korean Intellectual Property Office on Oct. 18, 2016 and assigned Serial No. 10-2016-0135099, the entire disclosure of which is incorporated herein by reference.

TECHNICAL FIELD

Embodiments of the present disclosure relate to electronic devices, and more specifically, electronic devices including a battery module having a battery cell and a printed circuit board connected together and methods for assembling a battery module in an electronic device.

DISCUSSION OF RELATED ART

Portable terminals or other electronic equipped with various capabilities are quickly spreading and becoming an inherent part of human's life.

Typically, portable terminals and other electronic devices may refer to a sort of device that may be utilized as a scheduler, music or video player, or phone or computer, which may be carried by the user. However, supplying power to the portable terminal through a constant supply source, such as a power outlet, restricts the portability of the terminal because of the need for connection with the power outlet.

The above information is presented as background information only to assist with an understanding of the present disclosure. No determination has been made, and no assertion is made, as to whether any of the above might be applicable as prior art with regard to the present disclosure.

SUMMARY

According to the present disclosure, an electronic device including a battery module may eliminate the need for a FPCB and a connector, leading to cost savings and simplified assembly.

According to the present disclosure, an electronic device including a battery module may have a minimized space for seating a battery therein, providing for a spacious room for mounting other components.

According to an embodiment of the present disclosure, an electronic device may comprise a housing including a mounting hole in which a battery module is mounted and a printed circuit board disposed adjacent to the mounting hole and electrically connected with the battery module. The battery module may include a battery cell having a connector projecting in a first direction, a terminal circuit including at least one connecting terminal electrically connected with the connector, a supporting case disposed at a side of the battery cell, seating the terminal circuit therein, and having an opening to expose at least part of the connecting terminal of the terminal circuit, and at least one upper film unit disposed facing a surface of the supporting case to protect the battery cell or the terminal circuit.

According to an embodiment of the present disclosure, a method for manufacturing a battery module may comprise preparing a pad-printed battery cell, attaching a first film to a surface of a connector projecting in a first direction in the battery cell, disposing a terminal circuit including at least one connecting terminal on an upper portion of the battery cell, disposing a supporting case having at least an opening so that at least part of the connecting terminal faces in the first direction or a second direction different from the first direction, wherein the terminal circuit is seated in the supporting case, and attaching a second film to cover at least part of the supporting case and the terminal circuit.

According to an embodiment of the present disclosure, an electronic device may comprise a battery module. The battery module may include a battery cell having a connector projecting in a first direction, a terminal circuit including at least one connecting terminal connected with the connector, a supporting case disposed at a side of the battery cell, seating the terminal circuit therein, and having an opening to expose at least part of the connecting terminal of the terminal circuit, and at least one upper film unit disposed facing a surface of the supporting case to protect the battery cell or the terminal circuit.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

Throughout the drawings, like reference numerals will be understood to refer to like parts, components, and structures.

DETAILED DESCRIPTION

Figure 1:
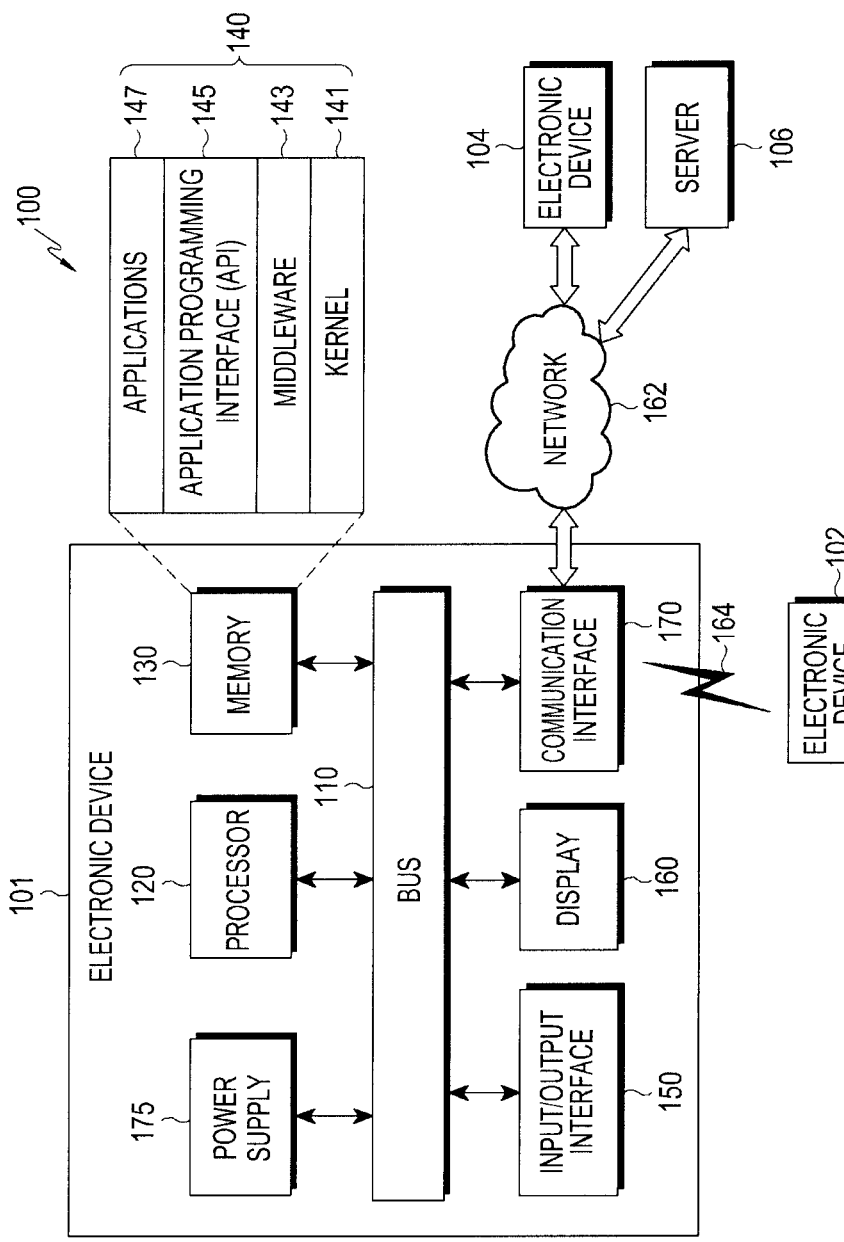
FIG. 1 is a view illustrating an electronic device in a network environment according to an embodiment of the present disclosure.

Hereinafter, embodiments of the present disclosure are described with reference to the accompanying drawings. However, it should be appreciated that the present disclosure is not limited to the embodiments and the terminology used herein, and all changes and/or equivalents or replacements thereto also belong to the scope of the present disclosure. The same or similar reference denotations may be used to refer to the same or similar elements throughout the specification and the drawings. It is to be understood that the singular forms "a," "an," and "the" include plural references unless the context clearly dictates otherwise. As used herein, the terms "A or B" or "at least one of A and/or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

Electronic Device

As noted above, portable terminals and other electronic device may provide various functions, allowing the user access to the various functions while moving.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or internet of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the disclosure, the electronic devices are not limited to those described above. As used herein, the term "user" may denote a human or another device (e.g., an artificial intelligent electronic device) using the electronic device.

Referring to FIG. 1, according to an embodiment of the present disclosure, an electronic device 100 is included in a network environment 100. The electronic device 100 may include a bus 110, a processor 120, a memory 130, an input/output interface 150, a display 160, and a communication interface 170. In some embodiments, the electronic device 100 may exclude at least one of the components or may add another component. The bus 110 may include a circuit for connecting the components 110 to 170 with one another and transferring communications (e.g., control messages or data) between the components. The processing module 120 may include one or more of a central processing unit (CPU), an application processor (AP), or a communication processor (CP). The processor 120 may perform control on at least one of the other components of the electronic device 100, and/or perform an operation or data processing relating to communication.

The memory 130 may include a volatile and/or non-volatile memory. For example, the memory 130 may store commands or data related to at least one other component of the electronic device 100. According to an embodiment of the present disclosure, the memory 130 may store software and/or a program 140. The program 140 may include, e.g., a kernel 141, middleware 143, an application programming interface (API) 145, and/or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 100 to at least one of the application programs 147 and process one or more task requests. The API 145 is an interface allowing the application 147 to control functions provided from the kernel 141 or the middleware 143. For example, the API 133 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 100 to the user or other external devices.

The display 160 may include, e.g., a liquid crystal display (LCD), a light emitting diode (LED) display, an organic light emitting diode (OLED) display, or a microelectromechanical systems (MEMS) display, or an electronic paper display. The display 160 may display, e.g., various contents (e.g., text, images, videos, icons, or symbols) to the user. The display 160 may include a touchscreen and may receive, e.g., a touch, gesture, proximity or hovering input using an electronic pen or a body portion of the user. For example, the communication interface 170 may set up communication between the electronic device 101 and an external electronic device (e.g., a first electronic device 102, a second electronic device 104, or a server 106). For example, the communication interface 170 may be connected with the network 162 through wireless or wired communication to communicate with the external electronic device.

The wireless communication may include cellular communication which uses at least one of, e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM). According to an embodiment of the present disclosure, the wireless communication may include at least one of, e.g., wireless fidelity (Wi-Fi), bluetooth, bluetooth low power (BLE), zigbee, near field communication (NFC), magnetic secure transmission (MST), radio frequency, or body area network (BAN). According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the European global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 100. According to an embodiment of the present disclosure, all or some of operations executed on the electronic device 100 may be executed on another or multiple other electronic devices (e.g., the electronic devices 102 and 104 or server 106). According to an embodiment of the present disclosure, when the electronic device 100 should perform some function or service automatically or at a request, the electronic device 100, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 100. The electronic device 100 may provide a requested function or service by processing the received result as it is or additionally. To that end, a cloud computing, distributed computing, or client-server computing technique may be used, for example.

However, in order to provide the various functions described above, the electronic device 100 includes power supply 175 to supply electrical power to the electronic device 100 and the other components therein. The electronic device 100 and can comprise a housing (as will be described in FIG. 2) which houses the bus 110 processor 120, memory 130, input/output interface 150, display 160, and communication interface 170, and power supply therein, as well as additional circuitry to facilitate provision of power from the power supply 175 to the bus 110 processor 120, memory 130, input/output interface 150, and display 160.

Housing and Power Supply

Connection to an electrical power outlet restricts the portability of the electronic device 100. A battery can provide the power needed by the electronic device 100 while permitting portability.

Embedded batteries for electronic devices adopt a high-cost flexible printed circuit board (FPCB) and suffer from an insufficient mounting space for a coupler to connect the FPCB to the board of the portable terminal. To connect the board of the electronic device with the embedded battery, a connector is placed on the FPCB. Installing the connector results in a waste of space and time. Producing a battery pack for electronic devices requires manual work to wrap an insulating film around a battery and seat the battery pack in the space, increasing assembly costs.

Figure 2:
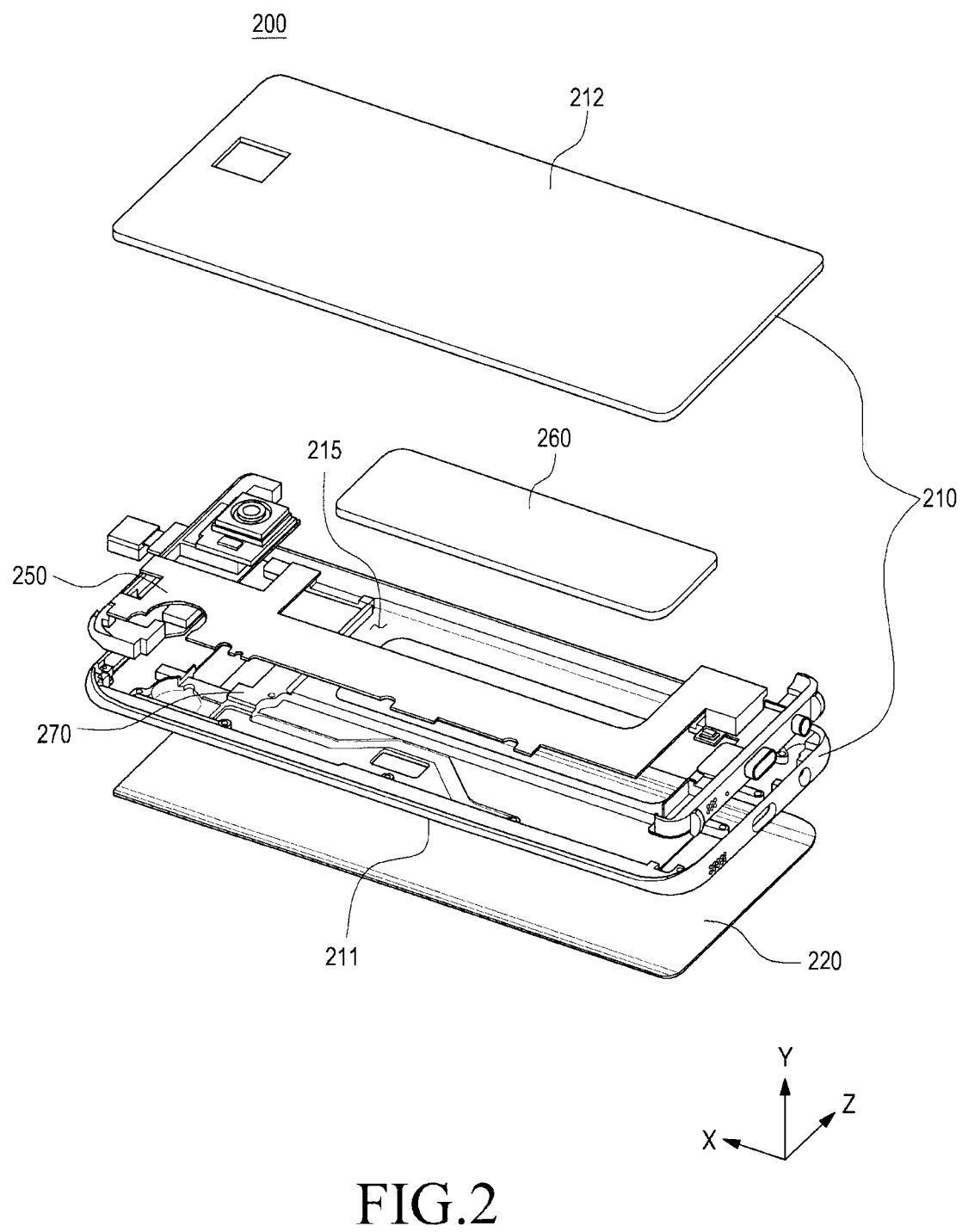
FIG. 2 is an exploded perspective view illustrating part of an electronic device according to an embodiment of the present disclosure.

FIG. 2 is an exploded perspective view illustrating part of an electronic device 200 according to an embodiment of the present disclosure.

In the three-dimensional rectangular coordinate system as shown in FIG. 2, 'X,' 'Y,' and 'Z,' respectively, may denote the length direction, thickness direction, and width direction of the electronic device 200. According to an embodiment of the present disclosure, 'X' may denote a first direction (+X or −X), 'Y' may denote a second direction (+Y or −Y), and 'Z' may denote a third direction (+Z or −Z).

Referring to FIG. 2, the electronic device 200 may include a housing 210, a display device 220, at least one printed circuit board (PCB) 250, and a battery 260.

According to an embodiment of the present disclosure, the housing 210 may be an element for receiving various electronic parts. At least part of the housing 210 may be formed of a conductive material. For example, the housing 210 may include side walls (along the Y axis) that form the external surface of the electronic device 200. The housing 210 may include a conductive material in its part that is exposed to the outside of the electronic device 200. A printed circuit board 250 and/or a battery 260 may be received inside the housing 210. For example, a processor (e.g., the processor 120 of FIG. 1), a communication module, various interfaces, a power management module, or a control circuit may be configured in the form of a chip and mounted on the printed circuit board 250. For example, the control circuit may be part of the processor or the communication module.

According to an embodiment of the present disclosure, the housing 210 may include a first surface 211 and a rear cover 212 that is spaced apart from the first surface 211 and positioned opposite the first surface 211. The rear cover 212 may protect the rear surface of the electronic device 200, and the rear cover 212, together with the display device 220, may form the outer look of the electronic device 200.

According to an embodiment of the present disclosure, the display device 220 may, at least partially, be formed of a material that transmits radio waves or magnetic fields. For example, the display device 220 may include a window member formed of reinforced glass and a display panel placed on an inner side surface of the window member. A touch panel may be provided between the window member and the display device. For example, the display device 220 may be utilized as an input device equipped with touch-screen functionality, not alone as an output device for outputting screen.

According to an embodiment of the present disclosure, the housing 210 may have a support 270 extending internally. The support 270 may be formed of a metal. The support 270 may be disposed in a space formed by the display device 220 and the rear cover 112. For example, the support 270 may be interposed between the display device 220 and the printed circuit board 250. The support 270 may prevent integrated circuit (IC) chips mounted on the printed circuit board 250 from contacting the display device 220. The support 270 may provide electromagnetic shielding, preventing electromagnetic interference between the IC chips. The support 270 may reinforce the rigidity of the electronic device 200. For example, the housing 210 may have several openings or recesses formed depending on the arrangement of the electronic parts inside the electronic device 200, reducing the rigidity of the housing 210 or the electronic device 200. The support 270 may be mounted and fastened inside the electronic device 210, reinforcing the rigidity of the housing 210 or the electronic device 200.

Although not shown in the drawings, according to an embodiment of the present disclosure, various structures may be formed on the surface of the housing 210 and support 270 depending on the arrangement of electronic parts inside the electronic device 200 or the structure in which the housing 210 and the support 270 are fastened together. For example, spaces for receiving IC chips mounted on the printed circuit board 250 may be formed in the housing 210 and/or the support 270. The spaces for the IC chips may be formed in recessed shapes or ribs surrounding the IC chips. According to an embodiment of the present disclosure, the housing 210 and the support 270 may have their corresponding fastening bosses or holes. For example, the housing 210 and the support 270 may be fastened together, with the support 270 facing or received in the housing 210 by fitting screws or other couplers to the fastening bosses or holes.

According to an embodiment of the present disclosure, the printed circuit board 250 may have a circuit of the terminal, e.g., at least one of an application processor (AP), a communication processor (CP), a memory, and a radio frequency (RF) transceiver, mounted thereon, and the printed circuit board 250 may include a signal line (e.g., a RF signal line).

According to an embodiment of the present disclosure, power supply may be provided to the integrated circuits and display 220 by placing the battery 260 in a mounting hole 215 that is formed in the housing 210. Now described are the certain embodiments of the structure of the battery 260 and the assembled structure of the battery 260 mounted in the electronic device 200.

Battery

Figure 3:
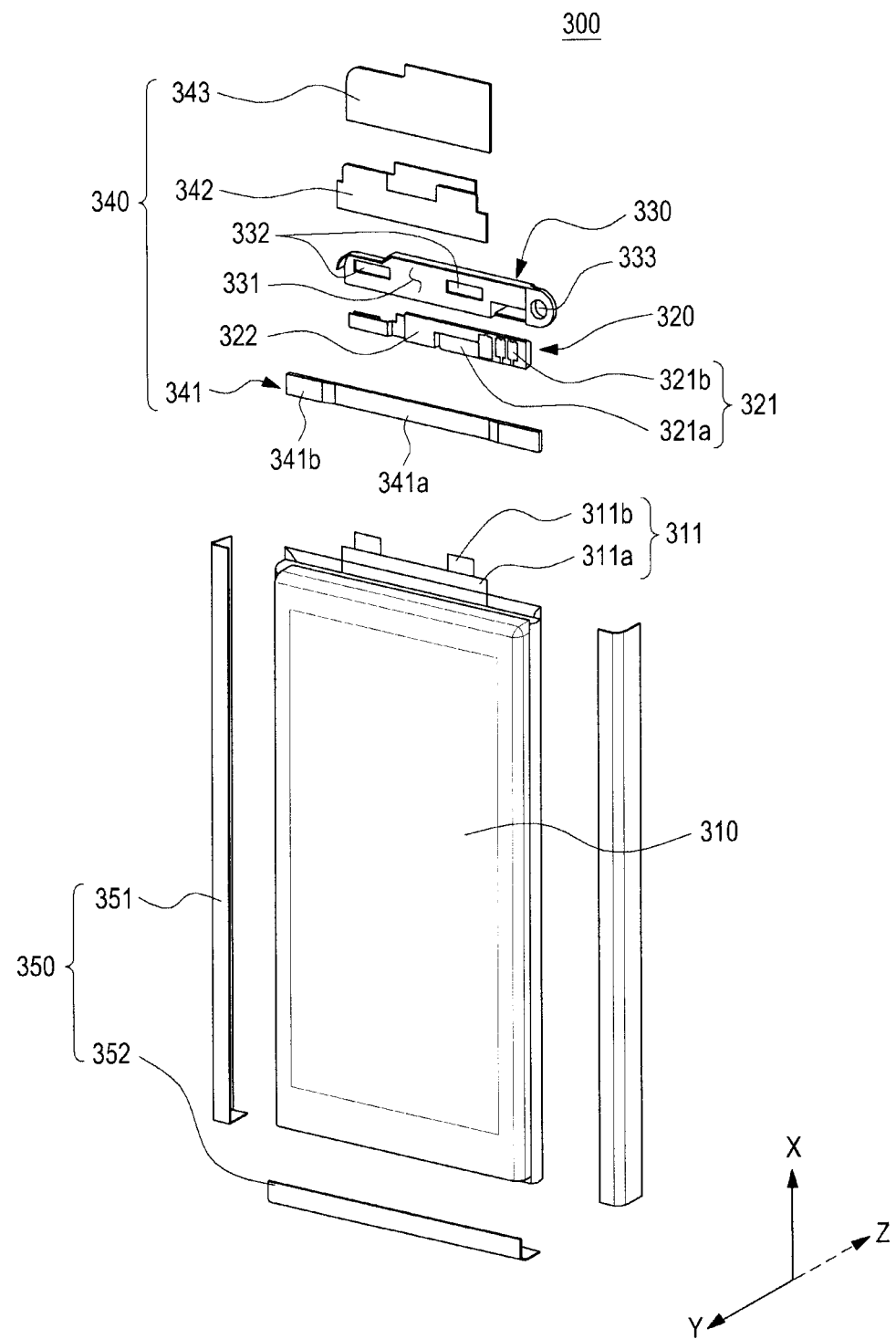
FIG. 3 is an exploded perspective view illustrating a battery module according to an embodiment of the present disclosure.

FIG. 3 is an exploded perspective view illustrating a battery 300 according to an embodiment of the present disclosure. The battery 300 of the electronic device shown in FIG. 3 may be the battery 260 of the electronic device 200 shown in FIG. 2.

Referring to FIG. 3, the battery 300 may include a battery cell 310, terminal circuit 320, a supporting case 330 wherein the terminal circuit is seated, and at least one film 340, 350. The battery cell 310 can include a connector 311. The terminal circuit 320 comprises a connecting terminal 321. According to an embodiment of the present disclosure, the battery cell 310 may include at least two or more cells and a cell holder in which the cells are assembled. Each cell may include, e.g., a lithium-ion cell. The battery cell 310 includes an electrode current collector (not shown in the drawings) having a stack of a first and second electrode plate (not shown in the drawings) with different polarities and a separator (not shown in the drawings) interposed between the first and second electrode plates (not shown in the drawings). To allow the battery cell 310 a high-output and high capability, a plurality of first electrode plates, second electrode plates, and separators may be stacked one over another.

According to an embodiment of the present disclosure, the battery cell 310 may include the connector 311 that projects in the first direction X. The connector 311 may form an electrical contact with the terminal circuit 320 and may include a positive (+) terminal and a negative (−) terminal. For example, the connector 311 disposed on an upper portion of the battery cell 310 may include a protruding surface 311a extending from the rear surface of the battery cell 310 and a contact surface 311b stepped from the protruding surface 311a and projecting relatively further from the protruding surface 311a in the first direction X.

According to an embodiment of the present disclosure, the terminal circuit 320 may include the connecting terminal 321 that is positioned facing at least a surface of the connector 311 of the battery cell 310. The connecting terminal 321 of the terminal circuit 320 may include a first connecting terminal 321a electrically connected with the battery cell 310 (via connector 311) and a second connecting terminal 321b electrically connected with the printed circuit board (e.g., the printed circuit board 250 of FIG. 2).

According to an embodiment of the present disclosure, the terminal circuit 320 may include a plurality of first connecting terminals 321a that are spaced apart from each other to correspond to the arrangement of the electrodes of the battery cell 310. For example, a surface of the first connecting terminal 321a may contact a first electrode (e.g., the + electrode), and another surface of the first connecting terminal 321a may contact a second electrode (e.g., the − electrode). The first connecting terminals 321a may be joined together by being individually welded or soldered with each of the first and second electrode.

According to an embodiment of the present disclosure, the second connecting terminal 321b may be disposed at a side of the terminal circuit 320. There may be provided at least two or more second connecting terminals 321b. For example, a surface of each second connecting terminal 321b may be exposed externally, and the second connecting terminals may be spaced apart from each other. According to an embodiment of the present disclosure, the second connecting terminals 321b may form an electrical contact by contacting at least part of the printed circuit board 250.

According to an embodiment of the present disclosure, the terminal circuit 320 may include an insulating plate 322 between the first connecting terminal 321a and the second connecting terminal 321b to space apart and insulate the first connecting terminal 321a and the second connecting terminal 321b from each other. According to an embodiment of the present disclosure, the insulating plate 322 may be disposed between the first connecting terminals 321a to space apart and insulate the first connecting terminals 321a from each other. According to an embodiment of the present disclosure, the insulating plate 322 may be disposed between the second connecting terminals 321b to space apart and insulate the second connecting terminals 321b from each other.

According to an embodiment of the present disclosure, the supporting case 330 may be disposed at a side of the battery cell 310, seating the terminal circuit 320 therein. The seated terminal circuit 320 may remain in stable electrical connection with the battery cell 310. According to an embodiment of the present disclosure, the supporting case 330 may include a seating portion 331 (with the perimeter of the hole along the Z-axis and the hole extending in the X direction) for seating the terminal circuit 320 and at least one hole 332 for welding or soldering the terminal circuit 320.

According to an embodiment of the present disclosure, the front surface of the supporting case 330 which faces in the second direction Y is open. The supporting case 330 has the seating portion 331 in the inside, supporting and/or protecting the terminal circuit 320 while substantially surrounding the overall area (or at least 90%) of the terminal circuit 320. According to an embodiment of the present disclosure, the seating portion 331 may be configured as a hole corresponding or mirroring (or a reverse negative) in shape to the terminal circuit 320, and the seating portion 331 may be designed to have a deeper inside portion, where the second connecting terminal 321b of the terminal circuit 320 is to be disposed.

According to an embodiment of the present disclosure, at least one hole 332 may be formed on the surrounding of seating portion 331, and the hole 332 may be positioned where the first connecting terminal 321a is to be seated to expose at least part of the first connecting terminal 321a. As set forth above, the first connecting terminal 321a may form a contact by being welded or soldered with the connector 311 of the battery cell 310. For the purpose of the welding or soldering, the hole 332 may be formed in a surface of the supporting case 330. For example, two holes 332 may be formed, corresponding to the number of the first connecting terminals 321a, assisting in the welding on the rear surface of the first connecting terminals 321a.

According to an embodiment of the present disclosure, the supporting case 330 may include a coupling hole 333 for stably fastening the terminal circuit 320 in the mounting hole (e.g., the mounting hole 215 of FIG. 2) of the housing. The coupling hole 333 is configured to keep the second connecting terminal 321b of the terminal circuit 320 in stable contact with the printed circuit board 250, and the coupling hole 333 may be disposed at a side of the second connecting terminal 321b (when the terminal circuit is seated in seating portion 331). Accordingly, a screw and fastening protrusion may be inserted into the coupling hole 333, fastening the terminal circuit 320. However, the number and arrangement of such coupling holes 333 according to the present disclosure are not limited thereto. The coupling hole 333 may be replaced by other various structures for fastening the terminal circuit 320 to the housing of the electronic device, e.g., ribs or tapes disposed around the terminal circuit 320.

According to an embodiment of the present disclosure, the film 340 and 350 may be arranged on a surface of each of the battery cell 310, the terminal circuit 320, and the supporting case 330, protecting the overall battery 300. The film units 340 and 350 may include at least one upper film unit 340 (including 341, 342, and 343) disposed on an upper portion of the battery cell 310 and at least one assisting film unit 350 (including 351 and 352) disposed on an edge of the battery cell 310.

According to an embodiment of the present disclosure, the upper film unit 340 may include a first film 341, a second film 342, and a third film 343. The first film 341 is disposed on the rear surface of the connector 311 of the battery cell 310, backing up the connector 311 which is formed of a thin layer. According to an embodiment of the present disclosure, the first film 341 may be formed in a length corresponding to the width direction of the battery cell 310. As another example, both end portions in the length direction of the first film 341 may be formed to be thicker than the rest of the first film 341. For example, a first portion 341a corresponding to a middle portion of the first film 341 may be formed to have a length and first thickness corresponding to the connector 311 of the battery cell 310, and second portions 341b corresponding to both end portions the first film 341 may be formed to have a length corresponding to the width of the rest of the battery cell 310 except for the connector 311 and a thickness corresponding to the sum of the first thickness and the thickness of the connector 311.

As such, the first film 341 may be designed to be shaped as a hole to seat the connector 311 therein, stably supporting the connector 311. However, the shape of the first film 341 is not limited thereto, and the first film 341 may rather be formed to have various thicknesses and lengths to support or fasten the connector 311.

According to an embodiment of the present disclosure, the second film 342 may be disposed on the front surface of the terminal circuit 320 and the supporting case 330 to cover at least part of the terminal circuit 320 and the supporting case 330. According to an embodiment of the present disclosure, the second film 342 may extend up to a front surface portion of the connector 311 of the battery cell 310, fastening the terminal circuit 320 to the battery cell 310.

According to an embodiment of the present disclosure, the second film 342 may be formed in a single adhesive layer and designed in a shape corresponding to the supporting case 330. The second connecting terminal 321b of the terminal circuit 320 may be configured to be excluded from the covered portion to be exposed in the second direction Y.

According to an embodiment of the present disclosure, the third film 343 may be disposed on the rear surface of the terminal circuit 320 and the supporting case 330 to cover at least part of the terminal circuit 320 and the supporting case 330. According to an embodiment of the present disclosure, the third film 343 may extend up to a rear surface portion of the connector 311 of the battery cell 310, fastening the terminal circuit 320 to the battery cell 310. According to an embodiment of the present disclosure, the second film 342 and the third film 343 may stably protect and shake-free support the terminal circuit placed inside.

According to an embodiment of the present disclosure, the assisting film unit 350 may include a side film 351 and a lower film 352. The side film 351 may be disposed on a lengthwise edge of the battery cell 310 to stably protect the side surface of the battery cell 310. According to an embodiment of the present disclosure, the side film 351 may be formed to have a length corresponding to the length direction of the battery cell 310. As another example, the side film 351 may be formed to have a length corresponding to the sum of the length of the connector 311 that projects in the first direction X and the length of the battery cell 310. As another example, the side film 351 may be designed in an L shape or an inverted-L shape to cover the edge. Two side films 351 may be provided to protect both lengthwise portions of the battery cell 310.

According to an embodiment of the present disclosure, the lower film 352 may be disposed on a widthwise edge of the battery cell 310 to stably protect the lower end surface of the battery cell 310. According to an embodiment of the present disclosure, the lower film 352 may be formed in a length corresponding to the width direction of the battery cell 310. As another example, the lower film 352 may be designed in an L shape or an inverted-L shape to cover the edge. Two lower films 352 may be provided to protect both lengthwise portions of the battery cell 310.

Figure 4:
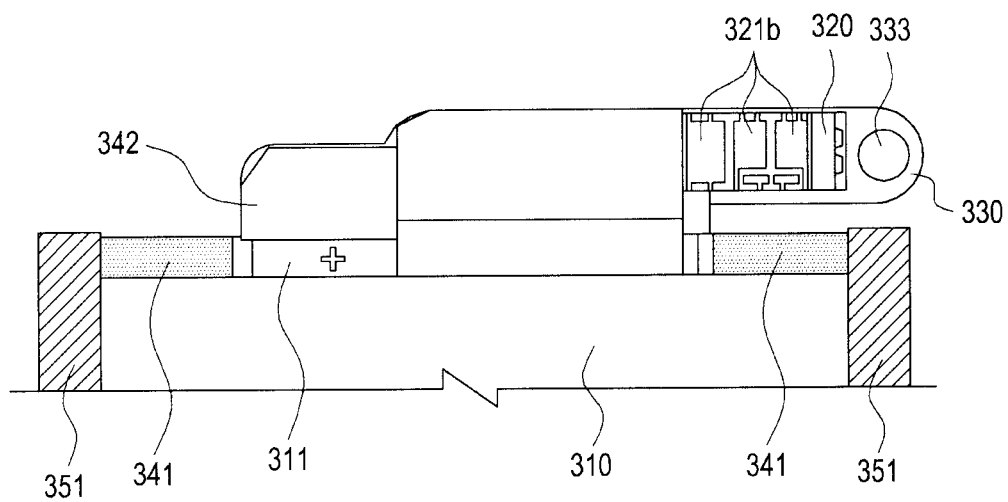
FIG. 4 is a front view illustrating an upper portion of a front surface of a battery module according to an embodiment of the present disclosure.
Figure 5:
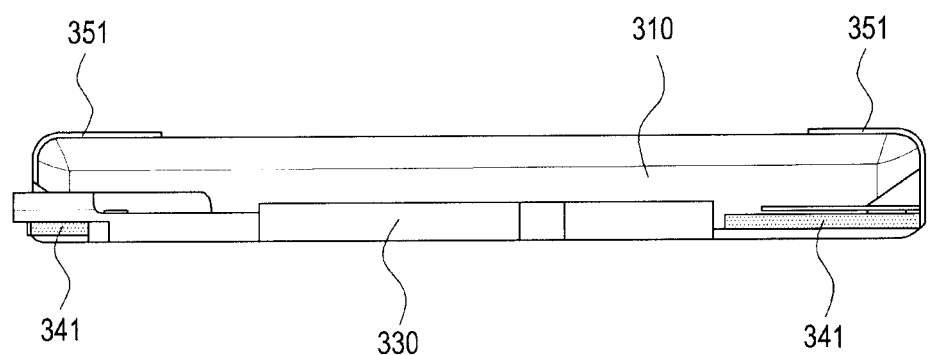
FIG. 5 is a side view illustrating an upper portion of a battery module according to an embodiment of the present disclosure.
Figure 6:
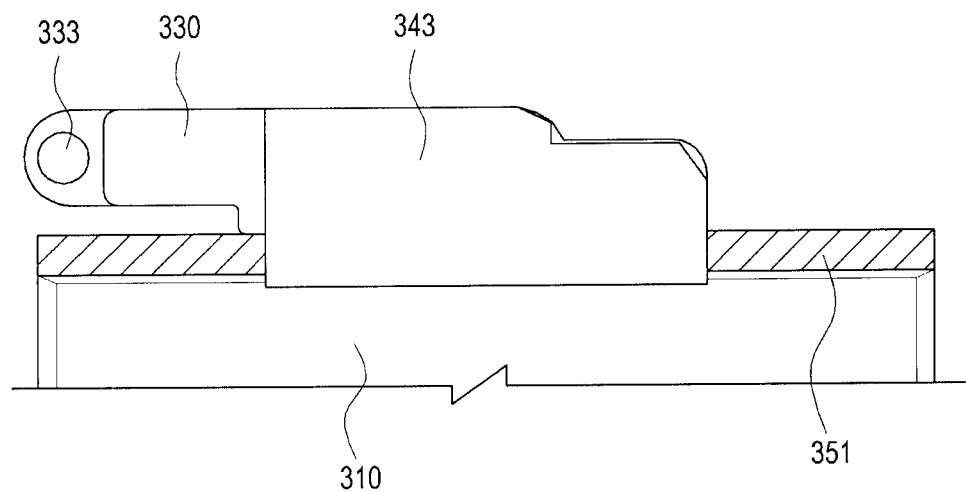
FIG. 6 is a rear view illustrating a rear surface of a battery module according to an embodiment of the present disclosure.

FIG. 4 is a front view illustrating an upper portion of a front surface of a battery 300 according to an embodiment of the present disclosure. FIG. 5 is a side view illustrating an upper portion of a battery 300 according to an embodiment of the present disclosure. FIG. 6 is a rear view illustrating a rear surface of a battery 300 according to an embodiment of the present disclosure.

The battery cell 310, the terminal circuit 320, the supporting case 330, and the film 340 and 350 of the battery 300 as shown in FIGS. 4 to 6, respectively, may correspond to the battery cell 310, the terminal circuit 320, the supporting case 330, and the film units 340 and 350 of the battery 300 of FIG. 3, respectively.

Referring to FIGS. 4 to 6, the battery 300 may include a battery cell 310 including a connector 311, a terminal circuit 320 including a connecting terminal 321, a supporting case 330 where the terminal circuit 320 is seated, and at least one film unit 340 and 350.

According to an embodiment of the present disclosure, at front view of the battery 300, the first film 341 may be disposed on an upper portion of the battery cell 310, and the terminal circuit 320 and the supporting case 330 may be arranged on an upper portion of the first film 341. The second film 342 may cover at least part of the terminal circuit 320 and the supporting case 330. Although not shown in FIG. 4, the connector 311 of the battery cell 310 may extend to the inside of the second film 342 to contact at least part of the terminal circuit 320. As another example, side films 351 may be provided to cover both edges of the battery cell 310.

According to an embodiment of the present disclosure, the battery 300 may be disposed so that the second connecting terminals 321b of the terminal circuit 320 are exposed to the front. Three second connecting terminals 321b may be provided which may form contacts to the printed circuit board (e.g., the printed circuit board 250 of FIG. 2) of the electronic device.

According to an embodiment of the present disclosure, when an upper portion of the battery 300 is viewed from the side, the supporting case 330 may be relatively thinner than the battery cell 310 and may seat therein the terminal circuit 320 and the connector 311, which are relatively thinner than the supporting case 330. To stably support the terminal circuit and the connector, the supporting case 330 may be disposed in a flat mounting hole, and the film units 340 and 350 may be arranged around the supporting case 330.

According to an embodiment of the present disclosure, at rear view of the battery 300, the first film 341 may be disposed on an upper portion of the battery cell 310, and the supporting case 330 may be disposed on an upper portion of the first film 341. As another example, the third film 343 may be disposed to cover at least part of the rear surface of the first film 341 and the supporting case 330. The first film 341, the supporting case 330, and the third film 343 may be disposed as if they overlap each other, firmly supporting and protecting the connector 311 of the battery cell 310

Figure 7:
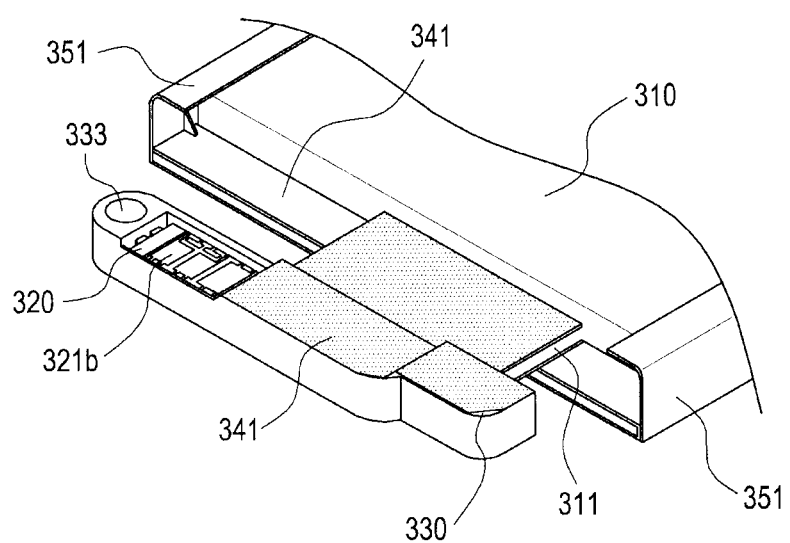
FIG. 7 is a perspective view illustrating an upper portion of a battery module according to an embodiment of the present disclosure.
Figure 8:
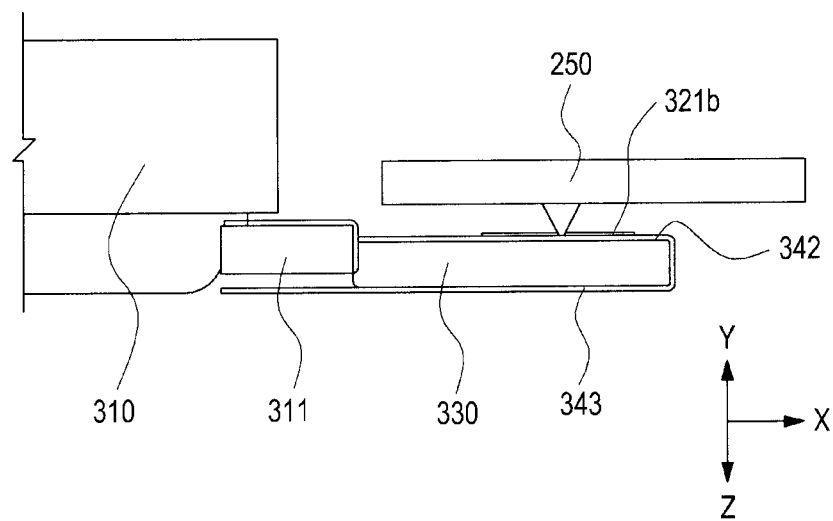
FIG. 8 is a side view illustrating a contact type of an upper portion of a battery module according to an embodiment of the present disclosure.

FIG. 7 is a perspective view illustrating an upper portion of a battery 300 according to an embodiment of the present disclosure. FIG. 8 is a side view illustrating a contact type of an upper portion of a battery 300 according to an embodiment of the present disclosure.

The battery cell 310, the terminal circuit 320, the supporting case 330, and the film units 340 and 350 of the battery 300 as shown in FIGS. 7 and 8, respectively, may correspond to the battery cell 310, the terminal circuit 320, the supporting case 330, and the film units 340 and 350 of the battery 300 of FIG. 3, respectively.

Referring to FIGS. 7 and 8, the battery 300 may include a battery cell 310 including a connector 311, a terminal circuit 320 including a connecting terminal 321, a supporting case 330 where the terminal circuit 320 is seated, and at least one film 341, 342, 343, and 351. There may be formed a plurality of second connecting terminals 321b of the terminal circuit 320 exposed through an opening in the supporting case 330, which may be disposed facing the electronic device (e.g., the electronic device 200 of FIG. 2) and the printed circuit board (e.g., the printed circuit board 250 of FIG. 2) in the second direction Y. When the printed circuit board 250 is moved along the third direction Z with the battery 300 seated inside the electronic device 200, the second connecting terminals 321b of the battery 300 may contact the printed circuit board 250. The present disclosure enables easier mounting of the battery in the housing and/or connecting the battery to the printed circuit board without the need for a coupling between the electronic device and the FPCB connected to the battery which is required according to the prior art, saving as much mounting space as the FPCB takes up. Accordingly, the structure according to the present disclosure leads to a further simplified assembly process and enlarged mounting space in the electronic device.

Figure 9:
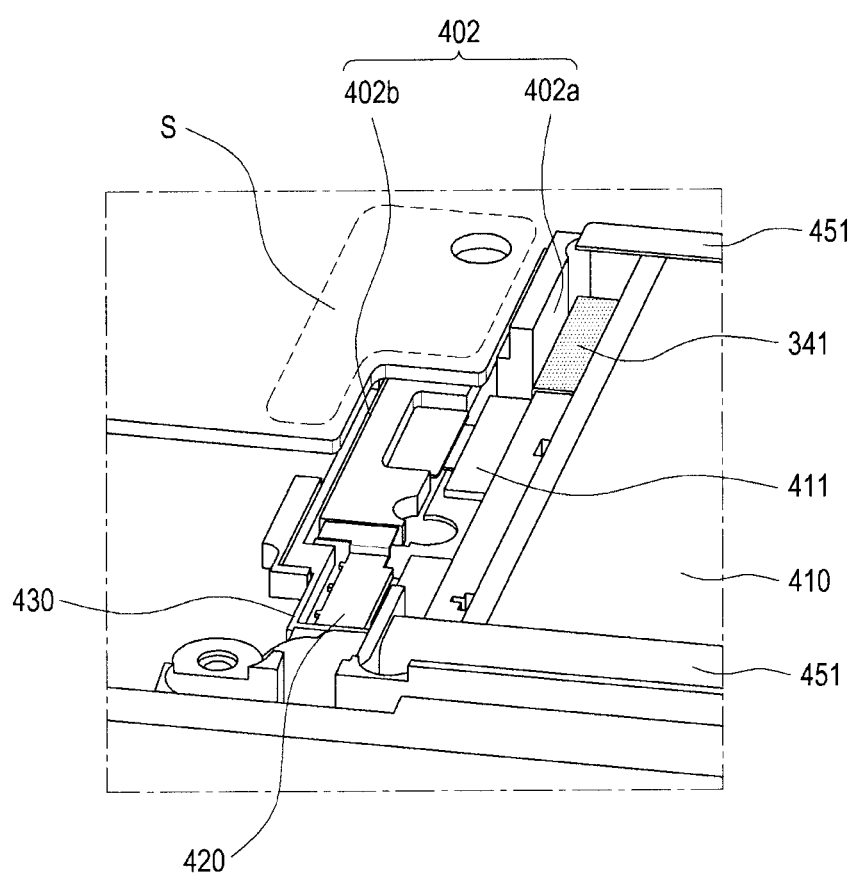
FIG. 9 is a perspective view illustrating an upper portion of a battery module mounted in a housing according to an embodiment of the present disclosure.
Figure 10:
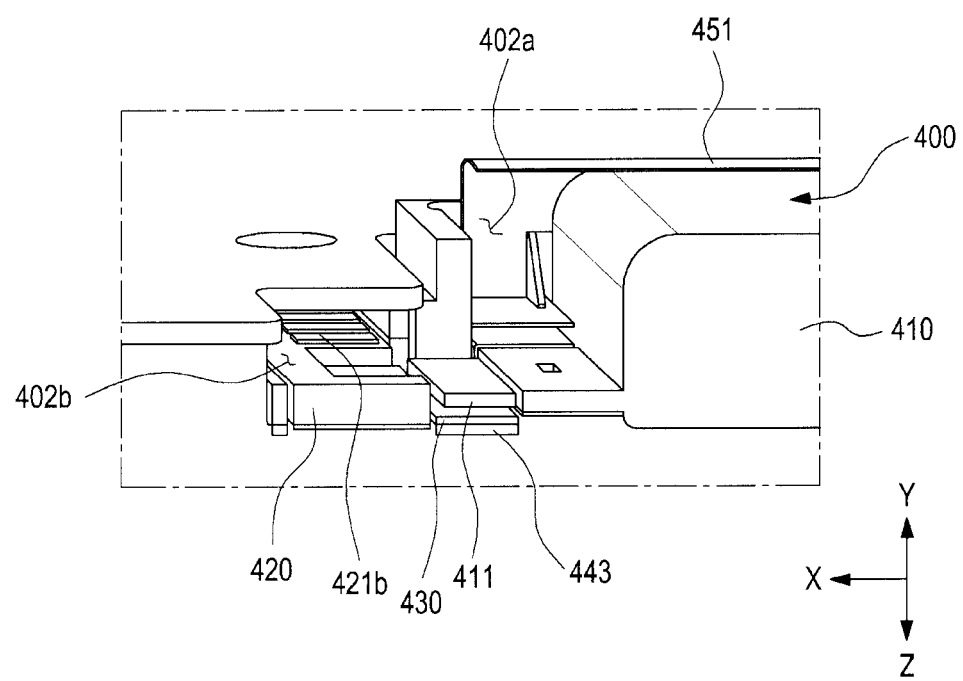
FIG. 10 is a cross-sectional view illustrating an upper portion of a battery module mounted in a housing according to an embodiment of the present disclosure.

FIG. 9 is a perspective view illustrating an upper portion of a battery 400 mounted in a housing of an electronic device according to an embodiment of the present disclosure. FIG. 10 is a cross-sectional view illustrating an upper portion of a battery 400 mounted in a housing of an electronic device according to an embodiment of the present disclosure.

The battery cell 410, the terminal circuit 420, the supporting case 430, and the film units 440 and 450 of the battery 400 as shown in FIGS. 9 and 10, respectively, may correspond to the battery cell 310, the terminal circuit 320, the supporting case 330, and the film units 340 and 350 of the battery 300 of FIG. 3, respectively.

Referring to FIGS. 9 and 10, a mounting hole 402 may be formed in the housing 401 to seat the battery 400. The mounting hole 402 may function as a space for receiving the battery 400 which may be formed in a recessed shape or by ribs surrounding the battery 400.

According to an embodiment of the present disclosure, the mounting hole 402 may include a rectangular main hole 402a according to the size of the battery cell 410 surrounded by the assisting film 450 and a sub hole 402b for receiving the supporting case 430 and the terminal circuit 420 arranged on an upper portion (in the first direction X) of the battery cell 410. For example, the sub hole 402b may be designed in a shape corresponding to the supporting case 430 which has a step, supporting the upper portion of the battery 400 inhibiting movement by external impacts to the electronic device.

According to an embodiment of the present disclosure, a look at the stack structure of the battery 400 seated in the mounting hole 402 shows that the battery cell 410 is seated in the main hole 402a and the first film 441 and/or the third film 443 attached to the connector 411 may be disposed on a lower end of the upper portion of the battery cell 410. As another example, the third film 443, the supporting case 430, and the terminal circuit 420 may be stacked in order in the sub hole 402b. The second film (not shown) may be attached onto the upper surface of the terminal circuit 420 and the supporting case 430. As another example, the side film 451 may be disposed on a side surface of the battery cell 410. The side film 451, the upper portion of the battery cell 410, and the rib of the mounting hole 402 may protect the connector which is placed inside. The film unit including, e.g., the first film 441, the third film 443, and the side film 451, enables the battery 400 to be substantially overall supported and insulated.

According to an embodiment of the present disclosure, the mounting hole 402 may be disposed on the support (e.g., the support 270 of FIG. 2) of the housing. The mounting hole 402 may be open in the second direction Y, seating the battery 400 in the third direction Z. After seating the battery 400, at least part of the printed circuit board (e.g., the printed circuit board 250 of FIG. 2) may be overlaid on the upper portion of the second connecting terminal 421b exposed in the second direction Y. The second connecting terminal 421b and the printed circuit board may be electrically connected together. According to an embodiment of the present disclosure, the battery 400 establishes an electrical contact with the printed circuit board 250, allowing for easier manufacturing. Further, the battery 400 eliminates the need for connecting a FPCB to the battery cell 410, providing for an enlarged mounting space S.

Figure 11:
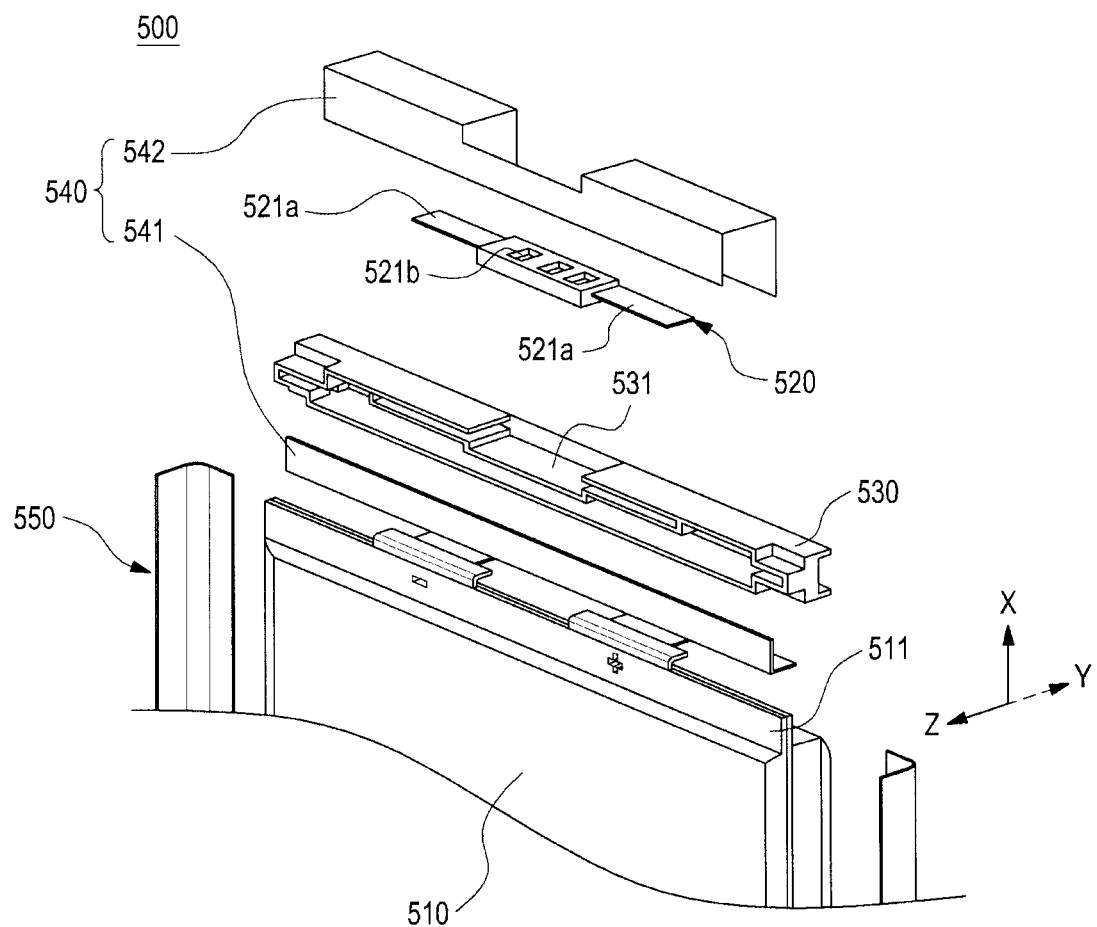
FIG. 11 is an exploded perspective view illustrating a battery module according to an embodiment of the present disclosure.
Figure 12:
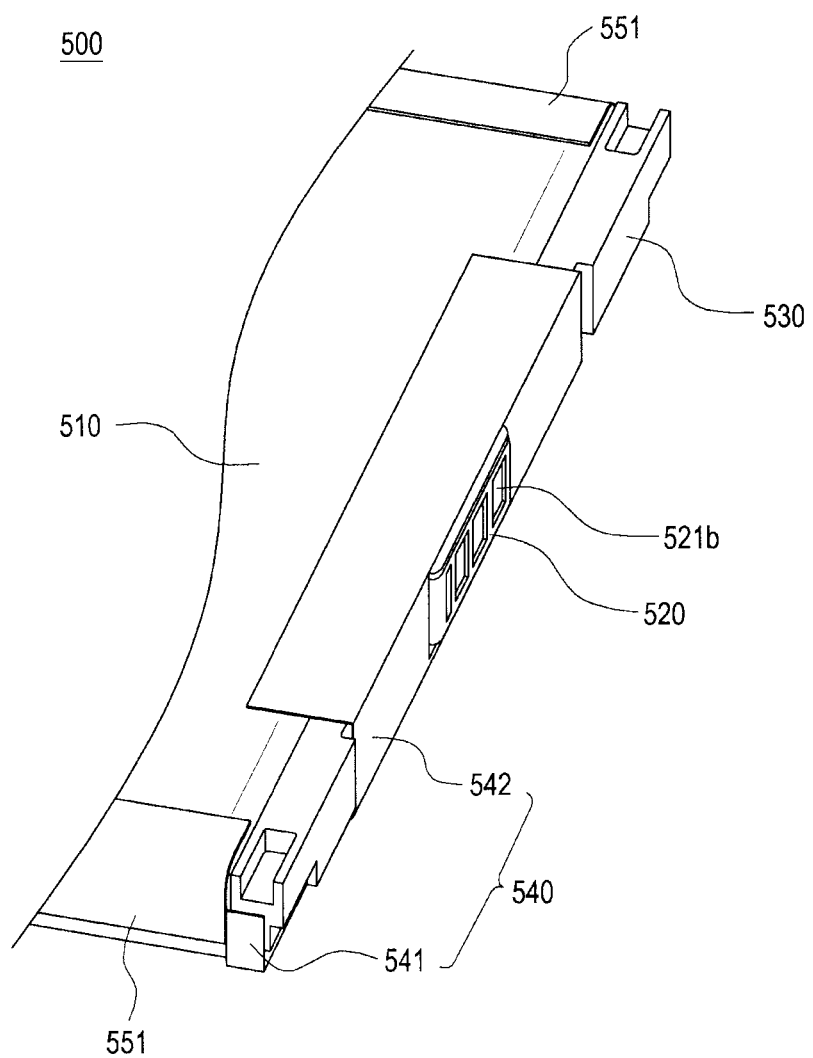
FIG. 12 is a perspective view illustrating an upper portion of a battery module according to an embodiment of the present disclosure.

FIG. 11 is an exploded perspective view illustrating a battery 500 according to an embodiment of the present disclosure. FIG. 12 is a perspective view illustrating an upper portion of a battery 500. The battery 500 of the electronic device shown in FIGS. 11 and 12 may correspond to the battery 260 of the electronic device 200 shown in FIG. 2.

Referring to FIGS. 11 and 12, the battery 500 may include a battery cell 510 including a connector 511, a terminal circuit 520 including a connecting terminal 521, a supporting case 530 where the terminal circuit 520 is seated, and at least one film 540 and 550. The configuration of the battery 300 of FIG. 3 may apply to the configuration according to FIGS. 11 and 12. The following description focuses on the differences.

According to an embodiment of the present disclosure, the battery cell 510 may include the connector 511 that projects in the first direction X. The connector 511 may form an electrical contact with the terminal circuit 520 and may include a positive (+) terminal and a negative (−) terminal. For example, the connector 511 disposed on the upper portion of the battery cell 510 extends from the middle of the upper portion of the battery cell 510, forming a projected surface. The projected surface may be stepped from the upper portion of the battery cell 510.

According to an embodiment of the present disclosure, the terminal circuit 520 may include the connecting terminal 521 that is positioned facing at least a surface of the connector 511 of the battery cell 510. The connecting terminal 521 of the terminal circuit 520 may include a first connecting terminal 521a electrically connected with the connector of the battery cell 510 and a second connecting terminal 521b electrically connected with the printed circuit board (e.g., the printed circuit board 250 of FIG. 2).

According to an embodiment of the present disclosure, there may be provided two first connecting terminals 521a that are disposed at both ends of the terminal circuit 520. The first connecting terminals 521a may be joined together by being individually welded with each of the electrodes disposed in the connector 511.

According to an embodiment of the present disclosure, the second connecting terminal 521b may be disposed at a middle of the terminal circuit 520. There may be provided at least two or more second connecting terminals 521b. For example, a surface of each second connecting terminal 521b may be exposed externally in the first direction X, and the second connecting terminals 521b may be spaced apart from each other. According to an embodiment of the present disclosure, the second connecting terminals 521b may form an electrical contact by contacting at least part of the printed circuit board 250.

According to an embodiment of the present disclosure, the terminal circuit 520 may include an insulating plate between the first connecting terminal 521a and the second connecting terminal 521b to space apart and insulate the first connecting terminal 521a and the second connecting terminal 521b from each other.

According to an embodiment of the present disclosure, the supporting case 530 may be disposed at a side of the battery cell 510, seating the terminal circuit 520 therein and keeping the terminal circuit 520 in stable electrical connection with the battery cell 510. According to an embodiment of the present disclosure, the supporting case 530 may include a seating portion 531 for seating the terminal circuit 520. According to an embodiment of the present disclosure, the front surface of the supporting case 530 which faces in the first direction X is open. The supporting case 330 has the seating portion 531 in the inside, supporting and/or protecting the terminal circuit 520 while surrounding the substantially overall area of the terminal circuit 520.

According to an embodiment of the present disclosure, the film units 540 and 550 may be arranged on a surface of each of the battery cell 510, the terminal circuit 520, and the supporting case 530, protecting the overall battery 500. The film 540 and 550 may include at least one upper film 540 disposed on an upper portion of the battery cell 510 and at least one assisting film 550 disposed on an edge of the battery cell 510.

According to an embodiment of the present disclosure, the upper film 540 may include a first film 541 and a second film 542. The first film 541 is disposed between the battery cell 510 and the supporting case 530, providing anti-shake side support for the connector 511 which is formed of a thin layer. According to an embodiment of the present disclosure, the first film 541 may be formed in a length corresponding to the width direction of the battery cell 510. As another example, the first film 541 may be formed to project to the area where contact to the connector 511 is made with respect to the film formed in the length direction. The first film 541 may be disposed in an area where the battery cell 510 faces the supporting case 530, preventing direct contact to the supporting case 530 and the battery cell 510. As another example, the first film 541 may place the thin-layered connector 511 in stable support, preventing the connector 511 from being shaken due to external impacts. However, the shape of the first film 541 is not limited thereto, and the first film 341 may rather be formed to have various thicknesses and lengths to support or fasten the connector 511.

According to an embodiment of the present disclosure, the second film 542 may be disposed on the upper portion of the terminal circuit 520 and the supporting case 530 to cover at least part of the terminal circuit 520 and the supporting case 530. According to an embodiment of the present disclosure, the second film 542 may be configured to have an opening in the center, allowing the connecting terminal 521 to be exposed in the first direction X. The second film 542 may extend up to a front and/or rear surface portion of the connector 511 of the battery cell 510, fastening the terminal circuit 520 to the battery cell 510.

According to an embodiment of the present disclosure, the assisting film 550 may include a side film 551 and a lower film (not shown). The side film 551 may be disposed on a lengthwise edge of the battery cell 510 to stably protect the side surface of the battery cell 510. According to an embodiment of the present disclosure, the side film 551 may be formed to have a length corresponding to the length direction of the battery cell 510. According to an embodiment of the present disclosure, the lower film (not shown) may be disposed on a widthwise edge of the battery cell 510 to stably protect the lower end surface of the battery cell 510.

Figure 13:
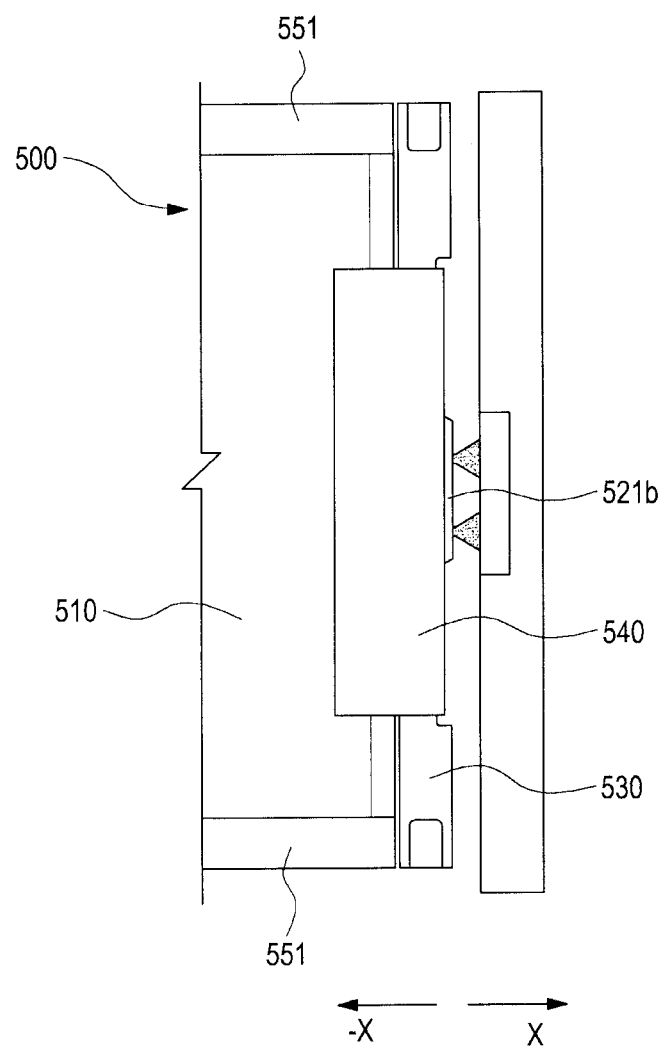
FIG. 13 is a front view illustrating a contact type of an upper portion of a battery module according to an embodiment of the present disclosure.

FIG. 13 is a front view illustrating a contact type of an upper portion of a battery 500 according to an embodiment of the present disclosure.

The battery cell 510, the terminal circuit 520, the supporting case 530, and the film units 540 and 550 of the battery 500 as shown in FIG. 13, respectively, may be the battery cell 510, the terminal circuit 520, the supporting case 530, and the film units 540 and 550 of the battery 500 of FIGS. 11 and 12.

Referring to FIG. 13, the battery 500 may include a battery cell 510 including a connector 511 as shown in FIGS. 11 and 12, a terminal circuit 520 including a connecting terminal 521b, a supporting case 530 where the terminal circuit 520 is seated, and at least one film 540 and 551. There may be formed a plurality of second connecting terminals (e.g., the second connecting terminals 521b) of the terminal circuit 520 exposed, which may be disposed facing the electronic device (e.g., the electronic device 200 of FIG. 1) and the printed circuit board (e.g., the printed circuit board 250 of FIG. 1) in the first direction X.

According to an embodiment of the present disclosure, when the printed circuit board (e.g., the printed circuit board 250) is moved along the first direction −X with the battery 500 seated inside the electronic device 200, the second connecting terminals 521b of the battery 500 may contact the printed circuit board 250. This enables easier mounting of the battery 500 without the an FPCB, saving the mounting space that the FPCB would occupy. Accordingly, the structure according to the present disclosure leads to a further simplified assembly process and saving mounting space in the electronic device.

Hereinafter, a process for assembling a battery 300 is described.

Process for Assembling Battery

Figure 14:
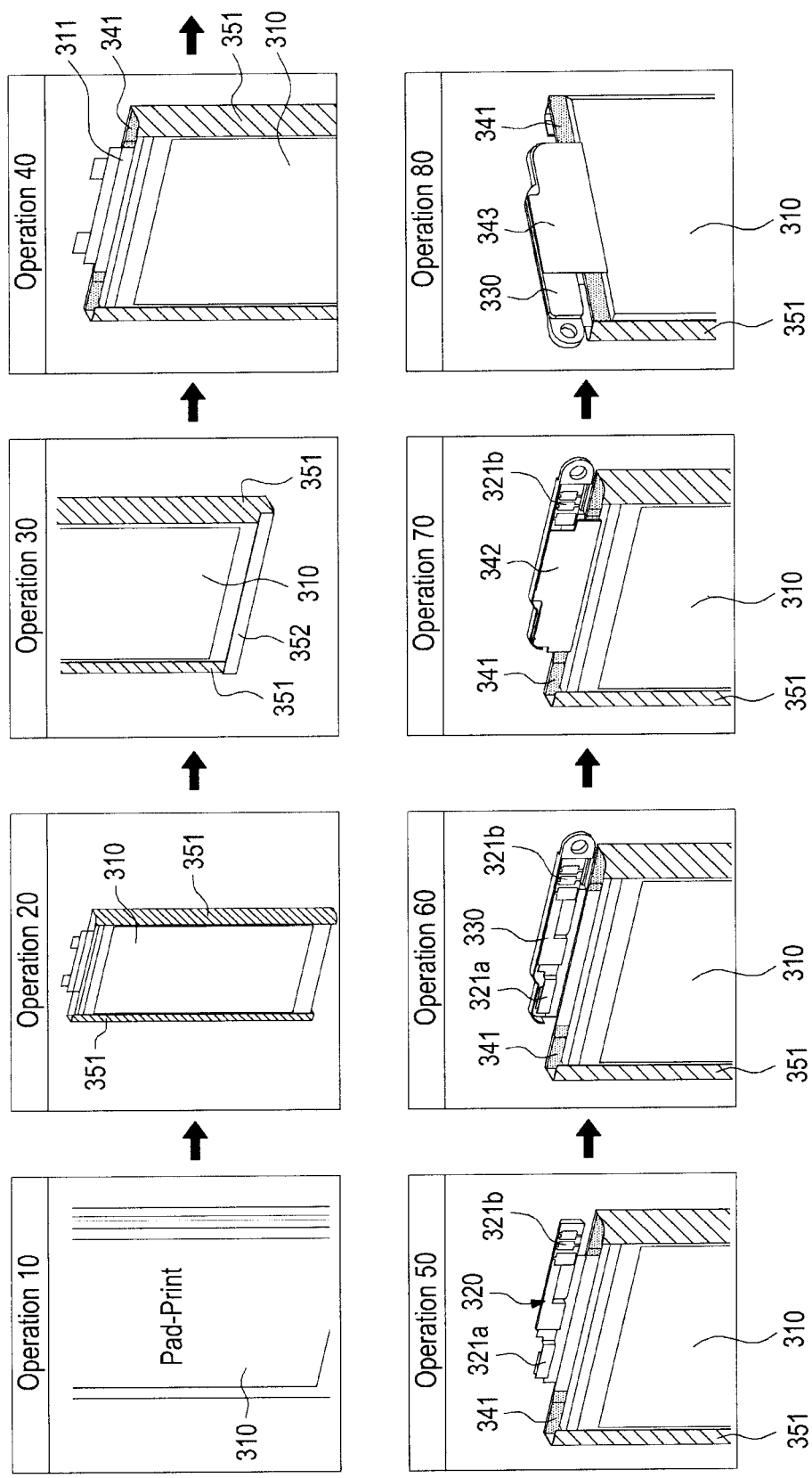
FIG. 14 is illustrates an assembly process for a battery module according to an embodiment of the present disclosure.
Figure 15:
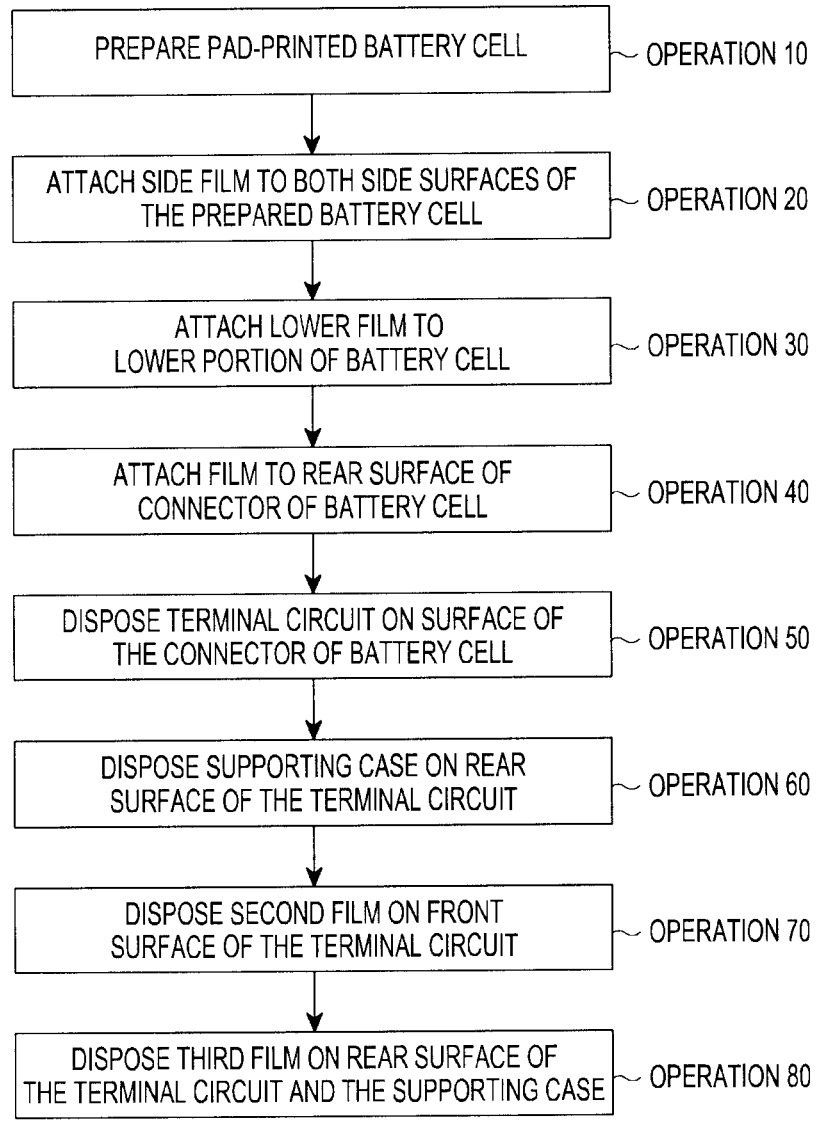
FIG. 15 is a flowchart illustrating the assembly process of FIG. 14.

FIG. 14 illustrates an assembly process according to the flow chart of FIG. 15 for a battery according to an embodiment of the present disclosure. The battery cell 310, the terminal circuit 320, the supporting case 330, and the film units 340 and 350 of the battery 300 as shown in FIG. 14, respectively, may correspond to the battery cell 310, the terminal circuit 320, the supporting case 330, and the film units 340 and 350 of the battery 300 of FIG. 3.

Referring to FIGS. 14 and 15, a pad-printed battery cell 310 may be prepared in operation 10. In operation 20, a side film 351 may be attached to both side surfaces of the prepared battery cell 310. The side film 351 may be attached to lengthwise edges of the battery cell 310 to stably protect the side surface of the battery cell 310. According to an embodiment of the present disclosure, the side film 351 may be formed to have a length corresponding to the length direction of the battery cell 310. The side film 351 may be configured in an L shape or an inverted-L shape to cover the edge. The side film 351 may be attached to both side surfaces of the battery cell 310 to protect both lengthwise portions of the battery cell 310.

After the side film 351 is attached, a lower film 352 may be attached to a lower portion of the battery cell 310 in operation 30. The lower film 352 may be disposed on a widthwise edge of the battery cell 310 to stably protect the lower end surface of the battery cell 310. According to an embodiment of the present disclosure, the lower film 352 may be formed to have a length corresponding to the width direction of the battery cell 310. The lower film 352 may be configured in an L shape or an inverted-L shape to cover the edge of the battery cell 310. However, the order of attachment of the side film 351 and the lower film 352 is not limited thereto. For example, the side film 351 may be attached after the lower film 352 is attached to stably cover the edge of the battery cell 310.

After the lower film 352 is attached, the first film 341 may be attached to the rear surface of the connector 311 of the battery cell 310 in operation 40. The first film 341 may extend from the rear portion of the connector 311 to the side film 351, placing the thin-layered connector 311 in anti-shake support.

According to an embodiment of the present disclosure, the first film 341 may be formed in a length corresponding to the width direction of the battery cell 310. As another example, both end portions in the length direction of the first film 341 may be formed to be thicker than the rest of the first film 341. For example, a middle portion of the first film 341 may be formed to have a length and first thickness corresponding to the connector 311 of the battery cell 310, and both end portions the first film 341 may be formed to have a length corresponding to the width of the rest of the battery cell 310 except for the connector 311 and a thickness corresponding to the sum of the first thickness and the thickness of the connector 311. As such, the first film 341 may be designed to be shaped as a hole to seat the connector 311 therein, stably supporting the connector 311. However, the order of attachment of the side film 351, the lower film 352, and the first film 341 is not limited thereto. For example, the side film 351, the lower film 352, and the first film 341 may be attached in various orders to stably cover the edge of the battery cell 310.

After the first film 341 is attached, a terminal circuit 320 may be disposed on a surface of the connector 311 in operation 50. The first connecting terminal 321a of the terminal circuit 320 may be disposed facing at least one surface of the connector 311 of the battery cell 310, making an electrical connection with the battery cell 310.

According to an embodiment of the present disclosure, the connecting terminal 321 of the terminal circuit 320 may include the second connecting terminal 321b that is positioned outside the first connecting terminal 321a and makes an electrical connection with the printed circuit board (e.g., the printed circuit board 250 of FIG. 2). The second connecting terminal 321b may be disposed to be exposed in the second direction Y.

After the terminal circuit 320 is disposed, a supporting case 330 may be disposed on the rear surface of the terminal circuit 320 in operation 60. The supporting case 330 may be disposed at a side of the battery cell 310, seating the terminal circuit 320 therein and keeping the terminal circuit 320 in stable electrical connection with the battery cell 310.

According to an embodiment of the present disclosure, the supporting case 330 may include a seating portion 331 for seating the terminal circuit 320 and at least one hole 332 for performing a welding process on the terminal circuit 320. For example, the at least one hole 332 may be positioned where the first connecting terminal 321a is seated. Thus, the first connecting terminal 321a may form a contact with the connector 311 of the battery cell 310 through the hole 332 by welding.

According to an embodiment of the present disclosure, the supporting case 330 may include a coupling hole 333 adjacent to the second connecting terminal 321b to stably fasten the terminal circuit 320 in the mounting hole (e.g., the mounting hole 215 of FIG. 2) of the housing. Accordingly, a screw may be inserted into the coupling hole 33, fastening the terminal circuit 320. However, the number and arrangement of such coupling holes 333 according to the present disclosure are not limited thereto. The coupling hole 333 may be replaced by other various structures for fastening the terminal circuit 320 to the housing of the electronic device, e.g., ribs or tapes disposed around the terminal circuit 320.

After the supporting case 330 is disposed, a second film 342 may be disposed on the front surface of the terminal circuit 320 and the supporting case 330 in operation 70. The second film 342 may be attached to cover at least part of the terminal circuit 320 and the supporting case 330. The second film 342 may extend up to a front surface portion of the connector 311 of the battery cell 310, fastening the terminal circuit 320 to the battery cell 310.

According to an embodiment of the present disclosure, the second film 342 may be formed in a single film layer and designed in a shape corresponding to the supporting case 330. The second connecting terminal 321b of the terminal circuit 320 may be configured to be excluded from the covered portion to be exposed in the second direction Y.

After the second film 342 is attached, a third film 343 may be disposed on the rear surface of the terminal circuit 320 and the supporting case 330 in operation 80. The third film 343 may be attached to cover at least part of the terminal circuit 320 and the supporting case 330. The third film 343 may extend up to a rear surface portion of the connector 311 of the battery cell 310, fastening the terminal circuit 320 to the battery cell 310. According to an embodiment of the present disclosure, the second film 342 and the third film 343 may stably protect and shake-free support the terminal circuit placed inside.

According to an embodiment of the present disclosure, an electronic device may comprise a housing including a mounting hole in which a battery is mounted and a printed circuit board disposed adjacent to the mounting hole and electrically connected with the battery. The battery may include a battery cell having a connector projecting in a first direction, a terminal circuit including at least one connecting terminal electrically connected with the connector, a supporting case disposed at a side of the battery cell, seating the terminal circuit therein, and having an opening to expose at least part of the connecting terminal of the terminal circuit, and at least one upper film unit disposed facing a surface of the supporting case to protect the battery cell or the terminal circuit.

According to an embodiment of the present disclosure, the connecting terminal of the terminal circuit may be exposed in the first direction or a second direction different from the first direction, and at least part of the printed circuit board may be disposed facing in the direction where the connecting terminal is exposed and forms an electrical contact with the connecting terminal.

According to an embodiment of the present disclosure, the upper film unit may include a first film disposed between the battery cell and the supporting case to support the connector of the battery cell and a second film disposed on a surface of the supporting case to protect at least part of the supporting case and the terminal circuit.

According to an embodiment of the present disclosure, the first film and the second film may include an insulating material.

According to an embodiment of the present disclosure, the mounting hole of the housing may include a main hole where the battery cell is seated and a sub hole where at least part of the connector of the battery cell and the terminal circuit seated in the supporting case are mounted. The sub hole may project from the main hole in the first direction and have at least one step corresponding to a shape of the supporting case.

According to an embodiment of the present disclosure, the supporting case may be open in a second direction perpendicular to the first direction to cover and support a rear surface of the connector and the connecting terminal, and a surface of the connector projecting in the first direction may be disposed facing the connecting terminal of the terminal circuit.

According to an embodiment of the present disclosure, the upper film unit may include a first film disposed between the battery cell and the supporting case to support the connector of the battery cell, a second film disposed facing in the second direction of the battery cell to cover at least part of the supporting case and the connector, and a third film disposed facing in a third direction which is an opposite direction of the second direction of the battery cell to cover at least a rear surface of the supporting case.

According to an embodiment of the present disclosure, the electronic device may further comprise a side surface disposed and attached to protect a side surface of the battery cell and a lower film disposed and attached to protect a lower portion of the battery cell.

According to an embodiment of the present disclosure, at least one coupling hole may be provided in an end of the supporting case. The terminal circuit disposed inside the supporting case may be fastened in the mounting hole of the housing by a coupling with the housing through the mounting hole.

According to an embodiment of the present disclosure, at least part of the terminal circuit disposed on an upper portion of the battery may overlap the printed circuit board when viewed from above the battery.

According to an embodiment of the present disclosure, the terminal circuit may include at least one first connecting terminal connected with the connector of the battery cell, at least one second connecting terminal disposed outside the first connecting terminal and connected with the printed circuit board, and an insulating plate insulating the first connecting terminal from the second connecting terminal.

According to an embodiment of the present disclosure, the supporting case may include a seating portion for seating the terminal circuit therein and at least one hole disposed inside the seating portion and formed in an area corresponding to the first connecting terminal.

According to an embodiment of the present disclosure, the at least one second connecting terminal may be exposed in the second direction, and the exposed connecting terminal and the printed circuit board may contact each other in the second direction to form an electrical contact.

According to an embodiment of the present disclosure, the first film may include a first portion where the connector of the battery cell is attached and disposed and a second portion disposed at both ends of the first portion and being thicker than the first portion.

According to an embodiment of the present disclosure, the supporting case may include a seating portion in the first direction to seat the terminal circuit therein, and the terminal circuit seated in the seating portion may have at least some of connecting terminals arranged inside formed to face in the first direction.

According to an embodiment of the present disclosure, the electronic device may comprise a first film disposed between the battery cell and the supporting case to support the connector of the battery cell and a second film disposed on an upper surface of the supporting case and open to expose at least some of the connecting terminals in the first direction.

According to an embodiment of the present disclosure, the at least one connecting terminal may be exposed in the first direction, and the exposed connecting terminal and the printed circuit board may contact each other in the first direction to form an electrical contact.

According to an embodiment of the present disclosure, a method for manufacturing a battery may comprise preparing a pad-printed battery cell, attaching a first film to a surface of a connector projecting in a first direction in the battery cell, disposing a terminal circuit including at least one connecting terminal on an upper portion of the battery cell, disposing a supporting case having at least an opening so that at least part of the connecting terminal faces in the first direction or a second direction different from the first direction, wherein the terminal circuit is seated in the supporting case, and attaching a second film to cover at least part of the supporting case and the terminal circuit.

According to an embodiment of the present disclosure, the method may further comprise, before or after attaching the first film to the surface of the connector projecting in the first direction in the battery cell, attaching a side surface to protect a side surface of the battery cell and attaching a lower film to protect a lower portion of the battery cell.

According to an embodiment of the present disclosure, in disposing the terminal circuit including the at least one connecting terminal on the upper portion of the battery cell, a plurality of first connecting terminals of the terminal circuit may be coupled with the connector of the battery cell, and second connecting terminals arranged outside the first connecting terminals may be exposed to form a contact with a printed circuit board.

According to an embodiment of the present disclosure, an electronic device may comprise a battery. The battery may include a battery cell having a connector projecting in a first direction, a terminal circuit including at least one connecting terminal connected with the connector, a supporting case disposed at a side of the battery cell, seating the terminal circuit therein, and having an opening to expose at least part of the connecting terminal of the terminal circuit, and at least one upper film unit disposed facing a surface of the supporting case to protect the battery cell or the terminal circuit.

As is apparent from the foregoing description, according to an embodiment of the present disclosure, an electronic device including a battery eliminates the need for an FPCB for connecting to the battery, leading to cost savings and simplified assembly for the battery in a contact type.

According to an embodiment of the present disclosure, an electronic device including a battery may have a minimized space for seating a battery therein, providing for a spacious room for mounting other components.

According to an embodiment of the present disclosure, in an electronic device including a battery, a board and a battery may be connected in a contact type, enabling easier assembly and replacement of a battery.

It is apparent to one of ordinary skill in the art that the camera modules according to various embodiments of the present disclosure as described above are not limited to the above-described embodiments and those shown in the drawings, and various changes, modifications, or alterations may be made thereto without departing from the scope of the present disclosure.

What is claimed is:
1. An electronic device, comprising:
a housing defining a mounting hole;
a printed circuit board disposed adjacent to the mounting hole;
a battery cell disposed in the mounting hole and electrically connected to the printed circuit board, the battery cell having a connector extending from an edge of the battery cell in a first direction;
a terminal circuit including at least one connecting terminal electrically connected with the connector to provide power to the printed circuit board;
a supporting case proximate to and substantially perpendicular to the edge of the battery cell that the connector extends from, the supporting case defining a seating portion in which the terminal circuit is disposed, and defining an opening exposing at least part of at least one connecting terminal of the terminal circuit, wherein the supporting case defines a coupling hole through which a fastener is insertable to secure the supporting case to the housing, wherein a perimeter of the coupling hole is on a plane that substantially perpendicular to the edge of the battery cell that the connector extends from; and
at least one upper film disposed facing a surface of the supporting case to protect the battery cell or the terminal circuit.

2. The electronic device of claim 1, wherein:
the connecting terminal of the terminal circuit is exposed in the first direction or a second direction different from the first direction, and
at least part of the printed circuit board is disposed facing in the first direction or the second direction in which the connecting terminal is exposed, and forms an electrical contact with the connecting terminal,
wherein securing the supporting case to the housing by inserting the fastener through the coupling hole further causes the terminal circuit to be secured in stable contact with the printed circuit board.

3. The electronic device of claim 2, wherein the upper film comprises:
a first film disposed between the battery cell and the supporting case to support the connector of the battery cell; and
a second film disposed on the surface of the supporting case to protect at least part of the supporting case and the terminal circuit.

4. The electronic device of claim 3, wherein the first film and the second film comprise insulating material.

5. The electronic device of claim 1, wherein the mounting hole of the housing includes a main hole where the battery cell is seated and a sub hole where at least part of the connector of the battery cell and the terminal circuit seated in the supporting case are mounted, wherein the sub hole projects from the main hole in the first direction and has at least one step corresponding to a shape of the supporting case.

6. The electronic device of claim 1, wherein the supporting case is open in a second direction perpendicular to the first direction to cover and support a rear surface of the connector and the connecting terminal, and wherein a surface of the connector projecting in the first direction is disposed facing the connecting terminal of the terminal circuit.

7. The electronic device of claim 6, wherein the upper film comprises:
a first film disposed between the battery cell and the supporting case to support the connector of the battery cell;
a second film disposed facing in the second direction of the battery cell to cover at least part of the supporting case and the connector; and
a third film disposed facing in a third direction which is an opposite direction of the second direction of the battery cell to cover at least a rear surface of the supporting case.

8. The electronic device of claim 6, wherein the housing further comprising:
a side film disposed and attached to protect a side surface of the battery cell; and
a lower film disposed and attached to protect a lower portion of the battery cell.

9. The electronic device of claim 7, wherein at least one coupling hole is provided in an end of the supporting case, and wherein the terminal circuit disposed inside the supporting case is fastened in the mounting hole of the housing by a coupling with the housing through the mounting hole, wherein at least part of the terminal circuit disposed on an upper portion of the battery cell overlaps the printed circuit board when viewed from above the battery cell.

10. The electronic device of claim 7, wherein the terminal circuit comprises:
at least one first connecting terminal connected with the connector of the battery cell;
at least one second connecting terminal disposed outside the first connecting terminal and connected with the printed circuit board; and
an insulating plate insulating the first connecting terminal from the second connecting terminal.

11. The electronic device of claim 10, wherein the supporting case includes a seating portion for seating the terminal circuit therein and at least one hole formed in an area corresponding to the first connecting terminal.

12. The electronic device of claim 10, wherein the at least one second connecting terminal is exposed in the second direction, and wherein the exposed connecting terminal and the printed circuit board contact each other in the second direction to form an electrical contact.

13. The electronic device of claim 7, wherein the first film includes a first portion where the connector of the battery cell is attached and disposed and a second portion disposed at both ends of the first portion and being thicker than the first portion.

14. The electronic device of claim 1, wherein the seating portion is in the first direction to seat the terminal circuit therein, and wherein the terminal circuit seated in the seating portion has at least some of connecting terminals arranged inside formed to face in the first direction.

15. The electronic device of claim 14, wherein the at least one upper film comprises:
a first film disposed between the battery cell and the supporting case to support the connector of the battery cell; and
a second film disposed on an upper surface of the supporting case and open to expose at least some of the connecting terminals in the first direction.

16. The electronic device of claim 15, wherein the at least one connecting terminal is exposed in the first direction, and wherein the exposed connecting terminal and the printed circuit board contact each other in the first direction to form an electrical contact.

17. A method for manufacturing a battery module, the method comprising:
preparing a pad-printed battery cell including a connector extending in a first direction from an upper edge of the pad-printed battery cell; wherein the battery cell is electrically connected to a printed circuit board;
attaching a first film to a surface of the connector of the pad-printed battery cell;
disposing a terminal circuit having at least one connecting terminal proximate to an upper portion of the pad-printed battery cell, the at least one connecting terminal electrically connectable to the connector to provide power to the printed circuit board of an electronic device;
disposing a supporting case proximate to and perpendicular to the upper edge of the pad-printed battery cell that the connector extends from, the supporting case defining a seating region in which the terminal circuit is disposed, and defining at least an opening to expose at least part of the at least one connecting terminal of the terminal circuit, wherein the supporting case defines a coupling hole through which a fastener is insertable to secure the supporting case to an electronic device housing, wherein a perimeter of the coupling hole is on a plane that is substantially perpendicular to the edge of the battery cell that the connector extends from; and
attaching a second film to the supporting case to cover at least part of the supporting case.

18. The method of claim 17, further comprising:

attaching a side film to protect a side surface of the pad-printed battery cell; and attaching a lower film to protect a lower portion of the pad-printed battery cell.

19. The method of claim 18, wherein:

the terminal circuit including the at least one connecting terminal is disposed on the upper portion of the pad-printed battery cell, a plurality of first connecting terminals of the terminal circuit are coupled with the connector of the pad-printed battery cell, and second connecting terminals arranged outside the first connecting terminals are exposed to form a contact with a printed circuit board.

20. An electronic device, comprising:

a battery cell including a connector extending in a first direction from an edge of the battery cell; wherein the battery cell is electrically connected to a printed circuit board;

a terminal circuit including at least one connecting terminal electronically connected with the connector to provide power to the printed circuit board of the electronic device;

a supporting case proximate to and perpendicular to the edge of the battery cell which the connector extends from, the supporting case defining a hollow region in which the terminal circuit is disposed, and defining an opening exposing at least part of the at least one connecting terminal of the terminal circuit, wherein the supporting case defines a coupling hole through which a fastener is insertable to secure the supporting case to a housing of the electronic device wherein a perimeter of the coupling hole is on a plane that is substantially perpendicular to the edge of the battery cell that the connector extends from; and at least one upper film disposed facing a surface of the supporting case to protect the battery cell or the terminal circuit.

* * * * *